United States Patent [19]

Kojima

[11] Patent Number: 5,291,118
[45] Date of Patent: Mar. 1, 1994

[54] DEVICE FOR DETECTING CONNECTION OR DISCONNECTION OF A BATTERY TO AN ELECTRIC CHARGER

[75] Inventor: Makio Kojima, Yokohama, Japan

[73] Assignee: Furukawa Denchi Kabushiki Kaisha, Yokohama, Japan

[21] Appl. No.: 897,775

[22] Filed: Jun. 12, 1992

[30] Foreign Application Priority Data

Jun. 14, 1991 [JP] Japan .................. 3-240120

[51] Int. Cl.$^5$ .............................. H02J 7/10
[52] U.S. Cl. ............................ 320/35; 320/37
[58] Field of Search ............... 320/35, 36, 31, 37

[56] References Cited

U.S. PATENT DOCUMENTS

| | | | |
|---|---|---|---|
| 3,917,900 | 11/1975 | Sherman, Jr. | 320/35 |
| 4,667,143 | 5/1987 | Cooper et al. | 320/35 X |
| 4,727,306 | 2/1988 | Misak et al. | 320/35 |

FOREIGN PATENT DOCUMENTS 2157511A 10/1985 United Kingdom .

OTHER PUBLICATIONS

United Kingdom Search Report, GB 9212692.9, Oct. 1, 1992.

*Primary Examiner*—R. J. Hickey
*Attorney, Agent, or Firm*—Armstrong, Westerman, Hattori, McLeland & Naughton

[57] ABSTRACT

The present invention relates to a device for detecting whether a battery is connected to an electric charger or the battery is disconnected therefrom. This invention is simple in construction, and can effectively carry out the operation thereof. The device of this invention includes a heat sensitive element connected through a temperature detecting line to a data processor and a reference voltage source connected to the end of the heat sensitive element. After at least one battery is connected to the device and an electric charging into the battery is completed, the battery is removed, whereby a data processor detects the resulting voltage change through the temperature detecting line similarly operating as a voltage detecting line.

2 Claims, 1 Drawing Sheet

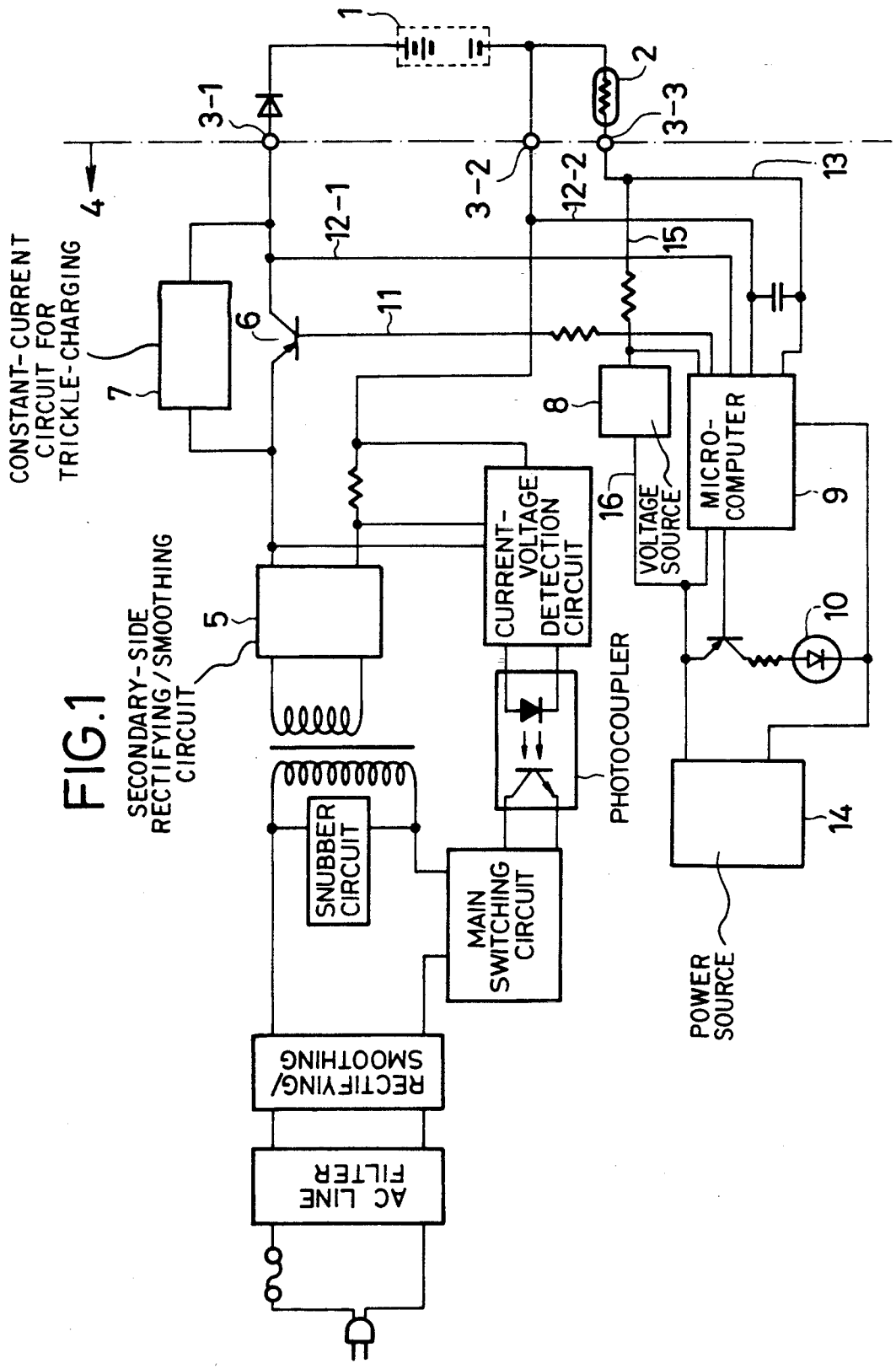

DEVICE FOR DETECTING CONNECTION OR DISCONNECTION OF A BATTERY TO AN ELECTRIC CHARGER

BACKGROUND OF THE INVENTION

1. Field of the Invention

The present invention generally relates to a device for detecting connection or disconnection of a battery to an electric charger.

2. Description of the Relevant Art

Secondary batteries, especially Ni-Cd storage batteries, are used in various fields as power sources for cordless telephones, video recorders and other home electric appliances. Generally, rapid charging is carried out in about 1-2 hours at a charging rate of between 0.5 C and 1.5 C. The Ni-Cd cell or battery is frequently used so that during the use thereof, it often requires an electrical charging, and in many cases, the rapid or quick charge is carried out. The quick charging operation means that the battery is subjected to a type of treatment which is carried out under a comparatively severe condition to the battery and therefore, it is necessary for the quick charging to be controlled so as not to overcharge the battery.

A $-\Delta V$ system and a temperature control system have been put into practical use as systems for controlling the rapid charge. The temperature control system is carried out in such a manner that a heat sensitive element (such as, a thermistor) is contained in a battery pack, and a temperature detecting line connected to an end of the thermistor is led to a data processor within an electric charger. The thermistor's resistance value is changed depending on a change in the ambient or environmental temperature. Therefore, if a current flowing therethrough or an electric voltage at the end of the thermistor is measured, the temperature around the thermistor can be effectively detected. Accordingly, if the data processor detects that the temperature of the battery has risen at around the time when the charging by the electric charger has ended, the rapid charging operation can be terminated. Thereafter, the rapid charging is switched to an ordinary trickle charging. Trickle charging means a charging operation by which a battery is electrically charged in a continuous manner with a current which is near the self-discharge of the battery.

There is another control system for controlling the rapid charging. This control system operates in such a manner that a timer is provided to control the charging time at a predetermined value. More particularly, the timer is set in advance for preventing the rapid charging from being continued for an excessive period of time on such an occasion when the temperature control system or the $-\Delta V$ system fails to operate for some reason, and a further continuous rapid charging is carried out beyond the predetermined time. This timer, however, has to be reset after the operation of the control system has ended or switched to a trickle charging. The timer is usually reset after it is detected that the storage battery after the completion of the charge is removed from the electric charger. Furthermore, the electric charger has lamps for indicating operations (such as, rapid charging and trickle charging), whereby the battery pack is not connected to the battery charger or the like.

The conventional charger is, in general, sufficient in that it detects whether the battery to be charged is connected thereto or not, and the lamp indication is changed over, and the timer is reset. For this purpose, a mechanical switch is used for detecting whether the battery pack is connected to the electric charger or not, and the switch is actuated by the size and weight of the battery. However, if the mechanical switch is used, the reliability thereof is decreased, and it is not suitable for use in a small-sized device. Furthermore, it has been hitherto carried out that the connection or disconnection of the battery pack is detected by a current or a voltage. However, in such an operation, there is the fear of erroneous detection in a case where the battery is inactive or deteriorated.

SUMMARY OF THE INVENTION

It is an object of the present invention to provide a device which is free from the above-discussed defects and is capable of detecting the connection or disconnection of the battery to an electric charger with a simple construction.

A structural arrangement for achieving the above-mentioned object of the present invention includes a device for detecting connection or disconnection of a battery to an electric charger in which the battery having a heat sensitive element provided thereon is connected at one end of the heat sensitive element through a temperature detecting line to a data processor to form a circuit for continuous monitoring from the start of charging into the battery and protecting the battery from rapid charging thereinto. This invention further includes a reference electric voltage source connected to the end of the heat sensitive element so that it is arranged in such a manner that when the data processor detects such an electric voltage at the temperature detecting line that is provided in a case where the electric charge is not loaded with the battery, and the battery has been detected to be disconnected with the electric charger by the data processor.

Since the battery to be charged is provided with the heat sensitive element when the battery is connected to the electric charger, an electric current flows through the heat sensitive element so that the voltage at the end of the heat sensitive element becomes lower than that of the reference electric voltage source. Here, the value detected at the temperature detecting line is low at the time of starting of the charging because it is varied with the battery voltage and the environmental temperature. Then, with the progress of the rapid charging, the change in the voltage between the terminals of the storage battery is detected, and thereafter, the electric charging is terminated. If the detected value through the temperature detecting line is not an abnormal one, the end of the charging by detection of the temperature is not carried out. At the time of the completion of the charging, if the battery (e.g., a battery pack) is removed from the electric charger, the temperature detecting line becomes disconnected with the heat sensitive element so that the voltage of the reference electric voltage source is applied, as is, to the temperature detecting line, and as a result, a large change in the voltage on the temperature detecting line is detected by the data processor, and the data processor decides that there is no battery connected, and it is convenient if for example, the indication of a lamp is changed and the resetting of a timer is carried out. Since the voltage of the reference voltage source hardly changes, the foregoing detection can be made accurately and reliably.

These and other features of the invention will be understood upon reading of the following description along with the drawing.

BRIEF DESCRIPTION OF THE DRAWING

FIG. 1 is a circuit diagram illustrating a battery to be charged, along with an electric charger of an embodiment of this invention.

DETAILED DESCRIPTION OF THE PREFERRED EMBODIMENTS

FIG. 1 is a diagram showing a battery (such as, a battery pack) to be charged and an electric charger as one embodiment of the present invention. In FIG. 1, reference numeral 1 denotes a battery pack to be electrically charged, reference number 2 denotes a thermistor as a heat sensitive element incorporated in the battery 1, reference numerals 3-1, 3-2, and 3-3 denote connection terminals connected between the battery 1 and the electric charger, and reference numeral 4 denotes the electric charger; that is, the left portion of the diagram divided by a dot-dash line shown therein. Reference numeral 5 denotes a secondary-side rectifying/smoothing circuit in the electric charger, reference number 6 denotes a transistor, reference number 7 denotes a constant-current circuit for trickle-charging, reference number 8 denotes a reference electric voltage source, reference 9 denotes a microcomputer as a data processor, reference number 10 denotes a light-emitting diode LED, reference number 11 denotes a quick charge stop signal line, reference numerals 12-1 and 12-2 denote voltage detecting lines for detecting the voltage between the terminals of the storage battery, reference number 13 denotes a temperature detecting line, reference number 14 denotes a power source for the microcomputer 9 and light-emitting diode, and reference numerals 15 and 16 denote connection lines of the reference voltage source 8. The microcomputer 9 operates as a data processor and does not provide an output signal to the quick charge stop signal line 11 at the initial stage; and thereby, the transistor 6 is made conductive for causing the rapid charging to be started. At that time, it is checked whether the battery 1 is connected to the electric charger 4 by way of the terminals 3-1 to 3-3. The voltage of the reference electric voltage source 8 is applied to the thermistor 2 through the connection line 15, and a current related with a resistance value based on the environmental temperature flows therethrough. Therefore, the voltage at the terminal 3-3 detected by the temperature detecting line 13 is lower than the reference voltage of, for example, 5 V of the reference voltage source 8. The degree of voltage drop in relation to the change of temperature is known in advance so that when the voltage detected by the temperature detecting line 13 is at a predetermined value or about the same, it is decided in the data processor 9 that the battery 1 is in a state of connection of the electric charger 4. At that time, the signal given to the transistor 6 is in the direction which causes the transistor 6 to be on an ON state. The current indicated when the rapid charging is started is, for example, 1.2 A. At that time, the microcomputer 9 causes the light-emitting diode 10 to emit light.

Thereafter, the microcomputer 9 continues to monitor the voltage between the terminals of the battery 1 through the voltage detecting lines 12-1 and 12-2, and when the completion or end of the rapid charging is detected by the $-\Delta V$ system, for instance, the microcomputer 9 outputs a signal to the transistor 6 through the rapid charge stop signal line 11 to cut off the conduction of the transistor 6. As a result, the rapid charging is changed-over to the trickle charging through the constant-current circuit 7, and the battery 1 undergoes the trickle charging. The microcomputer 9 causes the light-emitting diode 10 to blink.

From the above-described structural arrangement and operation, if the battery pack 1 which has been completed in the above-described electrical charging is removed from the terminals 3-1 to 3-3 of the electric charger 4 to cause the electric charger 4 to be at a no-load state, then the connection of the temperature detecting line 13 to the thermistor 2 becomes disconnected from each other, and the temperature detecting line 13 is connected only to the reference voltage source 8 through the connection line 15. As a result, the microcomputer 9 is applied with the voltage of the reference voltage source 8 as it is intact through the temperature detecting line 13, and consequently, the microcomputer 9(i.e., the data processor 9) detects such a raised voltage thereof and decides that the battery pack 1 has been removed from the electric charger 4 and the electric charger 4 is now in a no-load state. Accordingly, the microcomputer 9 turns off the light-emitting diode 10, and a timer which is prepared therein in advance for the rapid charging is reset.

Moreover, the thermistor is used as a heat sensitive element, but another kind of heat sensitive element may be used for constructing the present invention.

Thus, according to the present invention, since the heat detecting line used herein for preventing the overcharging of a battery incorporated in a heat sensitive element is utilized as a voltage-change detecting line for detecting the connection or disconnection of an electric charger to the battery, and since a data processor is connected through the temperature detecting line to a reference voltage source, the data processor can readily and effectively detect the voltage-change in conjunction with the connection or disconnection of the battery to the electric charger, and can easily and effectively decide the connection or disconnection of the battery to or from the electric charger. Further, since the voltage of the reference voltage source hardly changes as compared to the voltage of a storage battery, the data processor can detect and decide more assuredly the connection or disconnection of the battery to the electric charger.

While the invention has been particularly shown and described in reference to preferred embodiments thereof, it will be understood by those skilled in the art that changes in form and details may be made therein without departing from the spirit and scope of the invention.

What is claimed is:

1. A device for detecting connection or disconnection of a battery to or from an electric charger, said device comprising:

a circuit means for continuously monitoring from a start of charging of said battery and for protecting said battery from rapid charging thereof, said circuit means including a heat element, a temperature detecting line and a data processor, wherein one end of said heat element is connected to said battery, and wherein said temperature detecting line connects another end of said heat element to said data processor; and a reference voltage source connected to another end of said heat element, wherein when said data processor detects a voltage at said temperature detecting line in a case where said electric charger is in a no-load condition, then said data processor has detected said battery to be disconnected from said electric charger, and wherein said data processor having a timer which is set therein in advance for rapid charging is reset.

2. The device as in claim 1, further comprising a first connection line which connects said reference voltage source to said data processor, and a second connection line which connects said reference voltage to said another end of said heat element.

* * * * *